US008384095B2

(12) United States Patent
Lee et al.

(10) Patent No.: US 8,384,095 B2
(45) Date of Patent: Feb. 26, 2013

(54) ORGANIC LIGHT EMITTING DISPLAY DEVICE AND METHOD FOR MANUFACTURING THE SAME

(75) Inventors: Kyung-Hoon Lee, Goyang-si (KR); Jong-Hyun Park, Seoul (KR); Tae-Han Park, Seoul (KR); Hyun-Cheol Jeong, Garndang-ri (KR); Dong-Hee Yoo, Seoul (KR)

(73) Assignee: LG Display Co. Ltd., Seoul (KR)

( * ) Notice: Subject to any disclaimer, the term of this patent is extended or adjusted under 35 U.S.C. 154(b) by 475 days.

(21) Appl. No.: 12/643,441

(22) Filed: Dec. 21, 2009

(65) Prior Publication Data

US 2010/0155760 A1    Jun. 24, 2010

(30) Foreign Application Priority Data

Dec. 24, 2008    (KR) .................. 10-2008-0133274
Jul. 7, 2009    (KR) .................. 10-2009-0061771

(51) Int. Cl.
*H01L 29/18*    (2006.01)
*H01L 33/00*    (2010.01)

(52) U.S. Cl. ............... 257/88; 430/42; 430/43; 430/46; 430/82; 430/99; 313/503; 313/504; 313/506

(58) Field of Classification Search ............... None
See application file for complete search history.

(56) References Cited

U.S. PATENT DOCUMENTS

2004/0085014 A1* 5/2004 Park et al. .................. 313/504
2005/0147846 A1* 7/2005 Marks et al. ............... 428/690
2005/0287392 A1* 12/2005 Toyoda ........................ 428/690
2006/0087228 A1* 4/2006 Kobayashi ................. 313/504

(Continued)

FOREIGN PATENT DOCUMENTS

CN    1487776 A    4/2004
JP    2000-077307    3/2000

(Continued)

OTHER PUBLICATIONS

Office Action issued in corresponding Japanese Patent Application No. 2009-290267, mailed Oct. 5, 2011.

(Continued)

*Primary Examiner* — Julio J Maldonado
*Assistant Examiner* — Shantanu C Pathak
(74) *Attorney, Agent, or Firm* — Brinks Hofer Gilson & Lione

(57) ABSTRACT

Disclosed are an organic light emitting display device with improved yield and processing efficiency, which includes an interlayer capable of being separated into a hydrophilic region and a hydrophobic region on top of a hole injection layer in an organic light emitting device and a plurality of layers including a light emitting layer and which is fabricated without using a shadow mask, as well as a method for manufacturing the same. The manufacturing method includes preparing a substrate having a plurality of pixel regions defined in a matrix form, arranging an anode in each of the pixel regions, forming a hole injection layer on the anode by the solution process, forming an interlayer with hydrophobic properties on the hole injection layer by a solution process, selectively UV irradiating the interlayer to define a hydrophilic region on the interlayer, forming a light emitting layer on the interlayer by the solution process, and arranging a cathode on the substrate having the light emitting layer.

20 Claims, 14 Drawing Sheets

U.S. PATENT DOCUMENTS

2006/0115677 A1* 6/2006 Chun et al. .................. 428/690
2007/0190885 A1   8/2007 Aoki
2007/0248746 A1  10/2007 Ito et al.

FOREIGN PATENT DOCUMENTS

| JP | 2004-055177 | 2/2004 |
|----|-------------|--------|
| JP | 2004-296424 | 10/2004 |
| JP | 2005-302443 | 10/2005 |
| JP | 2006-013139 | 1/2006 |
| JP | 2006-127783 | 5/2006 |

OTHER PUBLICATIONS

Office Action issued in corresponding Chinese Patent Application No. 200910252840.6, mailed Oct. 26, 2011.

Search Report issued in corresponding European Patent Application No. 09175020.8; issued May 6, 2010.

* cited by examiner

Surface of test plate $\theta_1$

451

Surface of test plate $\theta_2$

452

ORGANIC LIGHT EMITTING DISPLAY DEVICE AND METHOD FOR MANUFACTURING THE SAME

This application claims the benefit of Korean Patent Applications Nos. P 10-2008-0133274, filed on Dec. 24, 2008 and No. P 10-2009-0061771, filed on Jul. 7, 2009, which is hereby incorporated by references in it entirety as if fully set forth herein.

BACKGROUND

1. Field of the Disclosure

The present disclosure relates to organic light emitting devices and, more particularly, to an organic light emitting display device with improved yield and processing efficiency, which includes an interlayer capable of being separated into a hydrophilic region and a hydrophobic region at a top of a hole injection layer in an organic light emitting device and a plurality of layers including a light emitting layer and which is fabricated without using a shadow mask, as well as a method for manufacturing the same.

2. Discussion of the Related Art

Recently, with progress towards an advanced information society, display applications for visual expression of electric information signals are rapidly growing. In response to such progress, a variety of thin, low weight, low power consumption and excellent performance flat display devices are currently being developed and rapidly replacing existing products such as cathode ray tubes (CRTs).

Examples of such a flat display device ("FDD") may include a liquid crystal display device (LCD), a plasma display panel device (PDP), a field emission display device (FED), an organic light emitting device (OLED), and the like.

Among these, an OLED useful for manufacturing a compact device and embodying a clear picture quality without need for an additional light source such as backlight is considered to be competitive in related applications.

In general, such an OLED requires an organic emitting layer and formation of the organic emitting layer is conducted by deposition using a shadow mask.

A conventional method for fabrication of an OLED will be described in detail by the following description with reference to the accompanying drawings.

FIG. 1 is a perspective view illustrating a general shadow mask and a process for deposition of a light emitting layer using the same.

As illustrated in FIG. 1, a commonly used shadow mask comprises a flat base 1 having at least one slit 2 extended in one direction at a certain width.

A vaporized emission material is exhausted as a gas through the slit 2 and is in turn deposited on a substrate 10 to form a light emitting layer 5.

FIG. 2 depicts a cross-section of the commonly used shadow mask with some problems thereof.

As illustrated in FIG. 2, the shadow mask 1 is positioned below the substrate 10 and the substrate 10 is placed such that the mask 1 is opposite to a face of the substrate on which a light emitting layer 5 is formed. In this case, vaporized gas is fed from a bottom of the mask 1 through slits 2 so as to form the light emitting layer 5.

However, if the shadow mask is used for a process for manufacturing a large-scale organic light emitting display device as shown in FIG. 2, a heavy weight of the shadow mask may cause deflection. Accordingly, the shadow mask has difficulty in repetitive use and may cause failure in forming a pattern on an organic emitting layer. For instance, use of the base 1 has problems in that the base may be bent or deformed, a cleaning agent ingredient may remain after rinsing, damage may occur at a boundary of the slit 2 during formation of the shadow mask 1, and/or alignment error may be encountered. Optionally, particles 1a generated during deposition may cause failure during a following deposition.

In order to solve the above problems, a novel alternative to conventional shadow masks is required. Specifically, there is a strong requirement for development of a new deposition process in order to replace use of a shadow mask in an apparatus for fabrication of a large-scale organic light emitting display device, which causes deflection of the center portion of the shadow mask due to a weight thereof.

A conventional process for fabrication of an organic light emitting display device commonly used in the art entails the following problems.

A process for fabrication of a large-scale organic light emitting display device has difficulties in manufacturing a product caused by a weight of a shadow mask and may cause pattern failure due to deflection of the shadow mask.

With regard to manufacturing of a large-scale organic light emitting display device, a new process for formation of an organic semiconductor layer including a light emitting layer is required.

In addition, for general evaporation deposition using a shadow mask, raw material consumption is high. Therefore, investigation into a process change has been proposed in order to increase raw material utilization efficiency.

SUMMARY

A method for manufacturing an organic light emitting display device, includes: preparing a substrate having a plurality of pixel regions defined in a matrix form; arranging an anode in each of the pixel regions; forming a hole injection layer on the anode by the solution process; forming an interlayer with hydrophobic properties on the hole injection layer by the solution process; selectively UV irradiating the interlayer to define a hydrophilic region on the interlayer; forming a light emitting layer on the interlayer by the solution process; and arranging a cathode on the substrate having the light emitting layer.

A method for manufacturing an organic light emitting display device according to an exemplary embodiment may include: preparing a substrate having a plurality of pixel regions defined in a matrix form; arranging an anode in each of the pixel regions; forming a hole injection layer on the anode by the solution process; forming an interlayer with a water contact angle of 70° or more and hydrophobic properties on the hole injection layer by the solution process; selectively UV irradiating the interlayer to enable hydrophilic treatment of the interlayer so as to have a water contact angle of less than 70° at the UV irradiated portion of the interlayer; forming a light emitting layer on the interlayer except for the UV irradiated portion; and arranging a cathode on the substrate having the light emitting layer.

An organic light emitting display device may include: a substrate having a plurality of pixel regions defined in a matrix form; an anode arranged in each of the pixel regions; a hole injection layer formed on the anode; an interlayer with hydrophobic properties formed on the hole injection layer by the solution process, wherein the interlayer has substantially the same interface properties at a face coming into contact with the hole injection layer as well as hydrophobic properties at the top thereof, and comprises a hydrophobic region and a hydrophilic region separated therein by UV irradiation;

a light emitting layer and an electron transport layer formed on the hydrophobic interlayer; and a cathode arranged on the electron transport layer.

The foregoing organic light emitting display device and the method for manufacturing the same according to the present invention have various advantages as follows.

After preparing a hole injection layer on an anode and then an interlayer, a following layer may be formed on top of the hole injection layer by the solution process. Here, a surface of the interlayer has hydrophobic properties with a water contact angle of 70° or more. The interlayer is composed of a material with UV activity and, after selective UV irradiation, a hydrophobic light emitting layer is formed on the interlayer except for a portion under hydrophilic treatment to control the water contact angle to less than 70°, so as to precisely align the light emitting layer in a patterned region of the interlayer. Briefly, the interlayer is hydrophobic when formed by a solution process and may have a hydrophilic region selectively defined by UV irradiation. Therefore, even if a solvent used for forming a top layer is hydrophobic, the solvent comes into contact with a hydrophobic part of the interlayer so as to enable precise alignment of the solvent in a patterned region of the interlayer.

Also, the interlayer is composed of the material with UV activity. After UV irradiation of the interlayer, the irradiated layer is aligned on a surface-treated region so as to enable precise alignment of the top layer (such as a light emitting layer and an electron transport layer) in a desired position.

For the fabricated organic light emitting display device, a layer (such as the light emitting layer together with upper and lower layers thereof) may be formed above the hole injection layer by the solution process and, therefore, a shadow mask typically used in the art may be omitted. As a result, process failure possibly caused by the shadow mask may be effectively prevented, thus enhancing productivity and yield. The present invention may enable film treatment and patterning using film characteristics and may be favorably applied to manufacturing of a large-scale organic light emitting display device.

Placing an interlayer on top of a hole injection layer, a solution process may be performed at an interface of the hole injection layer and an upper layer thereon without difficulty. The hole injection layer may be formed using a conductive polymer material so as to enhance luminance relative to current and extend a lifespan of a display device.

It is to be understood that both the foregoing general description and the following detailed description of the present invention are exemplary and explanatory and are intended to concretely describe the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, an organic light emitting display device and a method for fabricating the same according to the present invention will be described in detail from the following description with reference to exemplary embodiments, taken in conjunction with the accompanying drawings.

Figure 1:
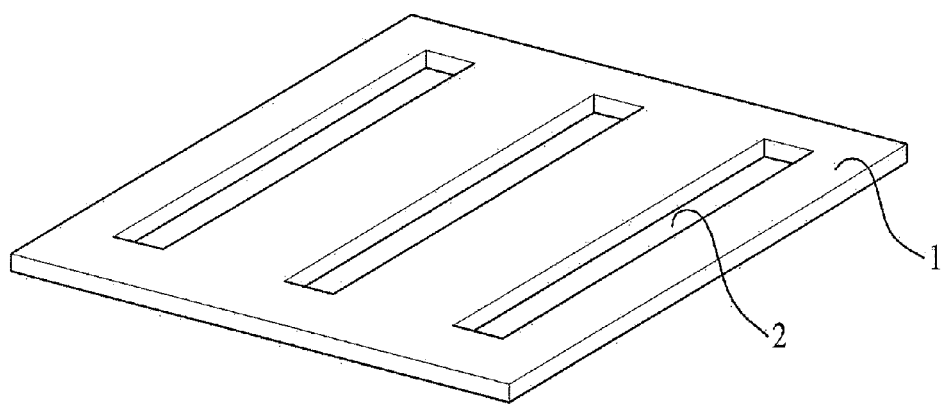
FIG. 1 is a perspective view illustrating a conventional shadow mask and a process for deposition of a light emitting layer using the shadow mask.
Figure 1:
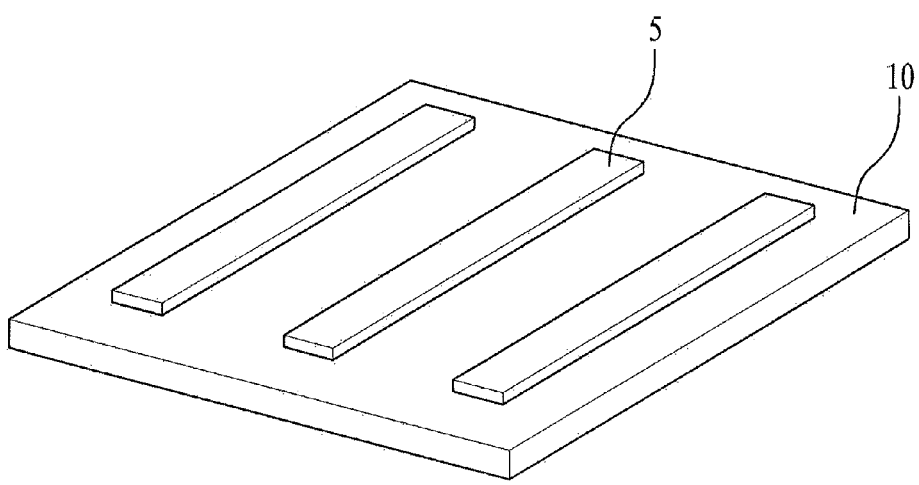
Figure 2:
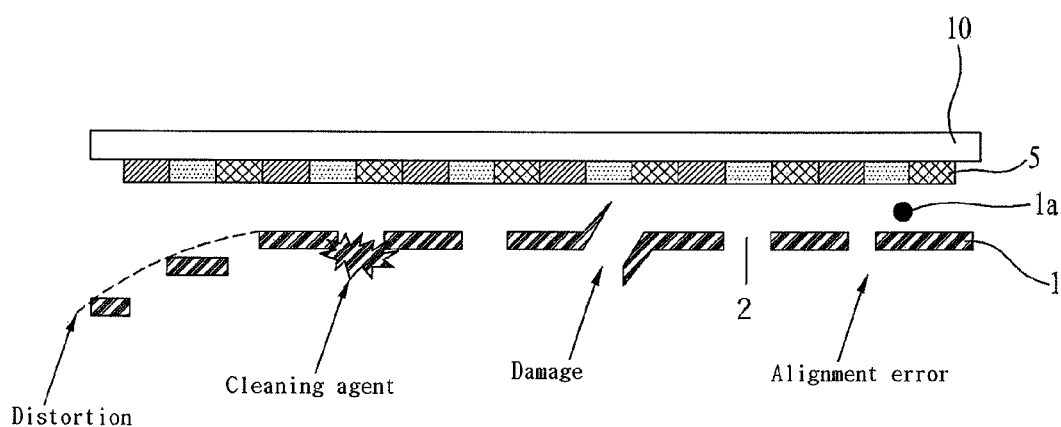
FIG. 2 is a cross-sectional view illustrating a conventional shadow mask with some problems thereof.
Figure 3:
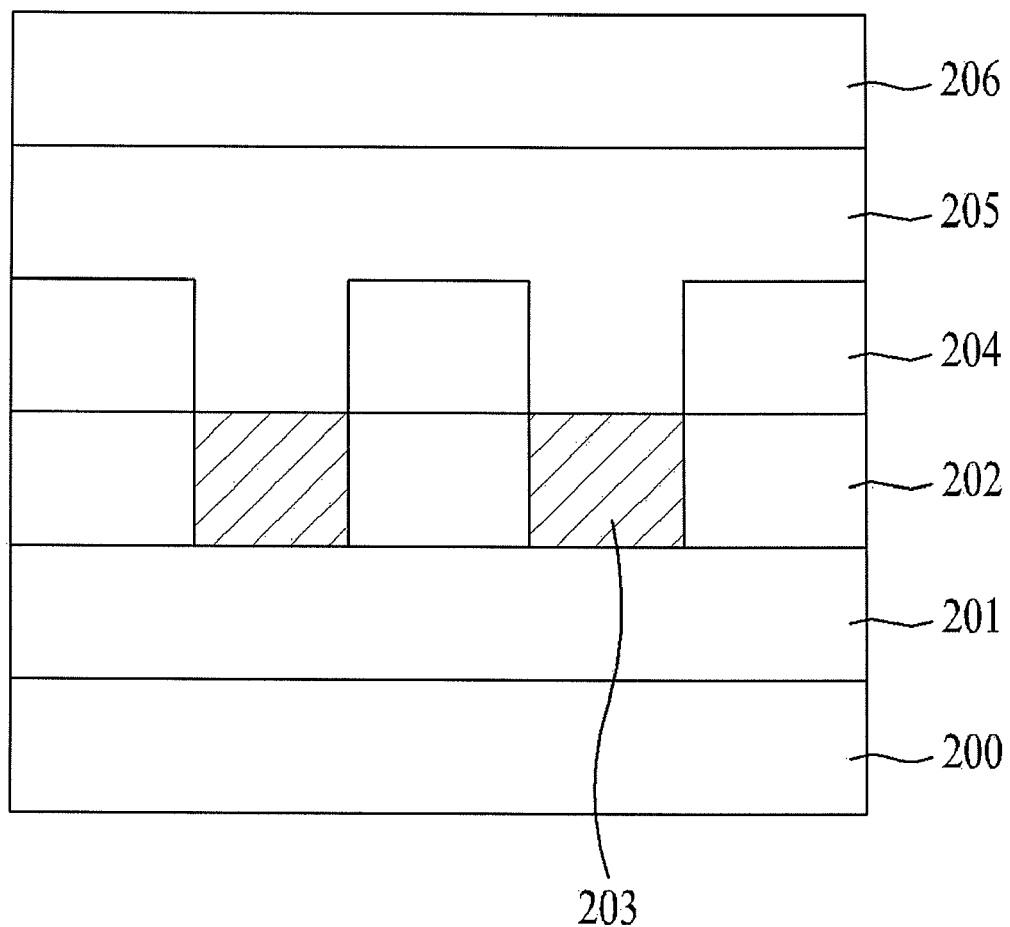
FIG. 3 is a cross-sectional view illustrating an embodiment of an organic light emitting display.

FIG. 3 is a cross-sectional view illustrating an organic light emitting display device of the present invention.

As illustrated in FIG. 3, the inventive organic light emitting display device comprises: a substrate having a plurality of pixel regions defined in a matrix form; an anode 200 arranged in each of the pixel regions; a hole injection layer 201 placed on the anode 200; an interlayer 202 having a hydrophilic region 203 and a hydrophobic region; a light emitting layer 204 formed in the hydrophobic region of the interlayer 202 and an electron transport layer 205 placed on the substrate having the light emitting layer 204; and a cathode 206 arranged on the electron transport layer 205.

Although the interlayer 202 initially formed by a solution process has hydrophobic properties, selectively UV irradiating the same may modify the irradiated part 203 to be hydrophilic or remove the irradiated part, thereby enabling selective formation of plural films by the solution process.

When the hole injection layer 201 contains a super-hydrophilic conductive polymer such as polystyrene-sulphonate-doped polyethylene-dioxythiophene (PEDOT:PSS), the interlayer 202 having super-hydrophilic properties may be provided in order to eliminate difficulty in directly applying a hydrophobic solvent to the hole injection layer 201.

Briefly, the interlayer 202 primarily comprises the hydrophilic region 203 formed by UV treatment as well as the hydrophobic region. Here, the light emitting layer 204 on top of the interlayer 202 may be selectively formed in the hydrophobic region, which was not subjected to selective UV irradiation, when a solution is applied to the interlayer 202 by the solution process.

In this case, a top of the interlayer 202, especially, a surface thereof on which the light emitting layer 204 is formed may have hydrophobic properties with a water contact angle of 70° or more.

As for raw materials, the interlayer 202 may comprise a material with UV absorption or photolysis performance. Alternatively, the interlayer 202 may have modified physical properties such as hydrophilic properties without being patterned by UV irradiation.

The interlayer 202 may contain an organic material having at least one bond selected from C—C, C=N, C=C, Si—O, C—O, C=O, etc. For instance, the interlayer may have at least one functional group selected from a group consisting of imide, amine, silane, carbonate, ester, acetate, sulfonate, nitrate, ketone, fluorine, oxetane, epoxy, and the like. An example of the organic material having an amine group is triphenylamine.

Hereinafter, examples of an organic ingredient contained in the interlayer 202 will be described in detail.

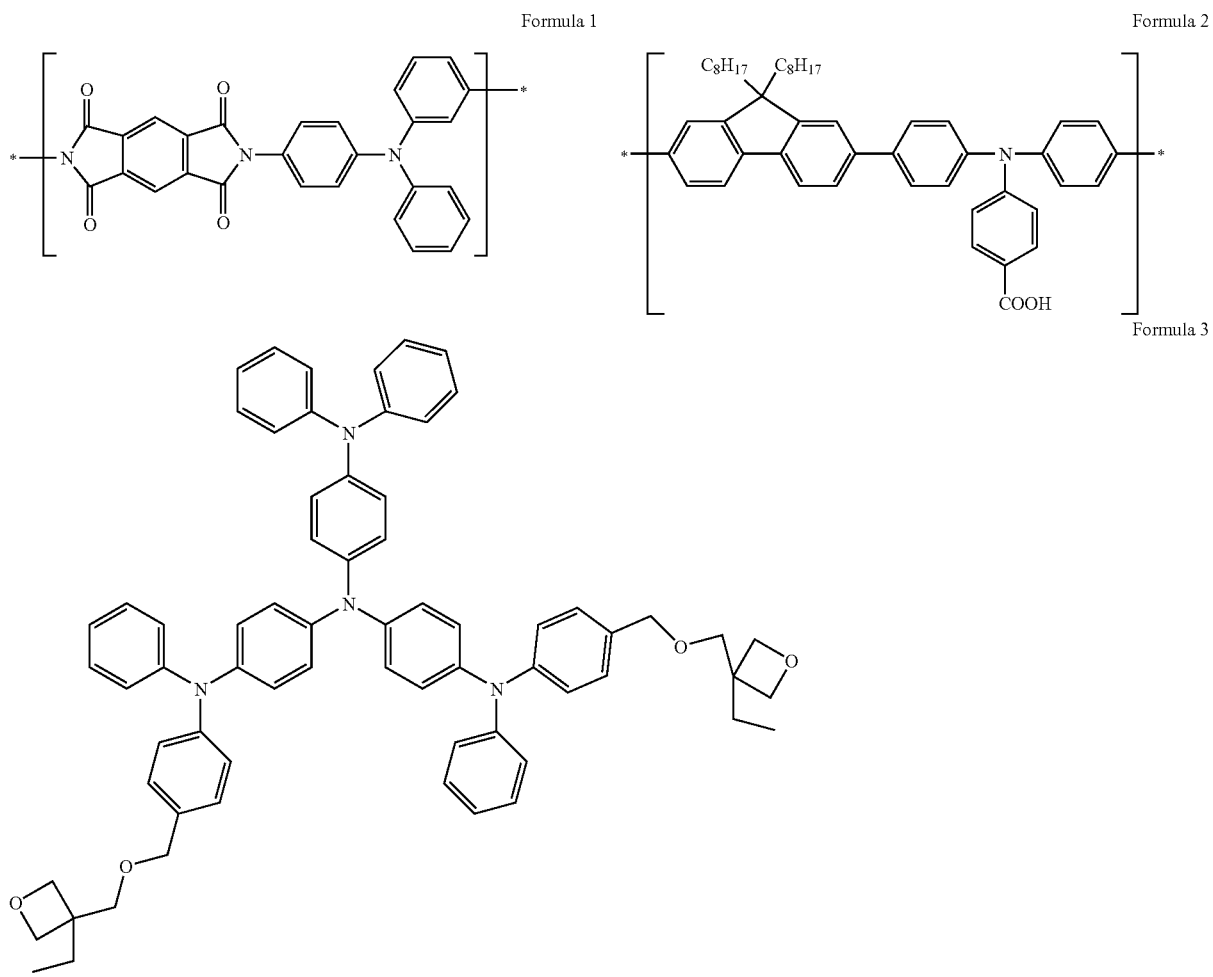

Here, all the interlayer 202, the light emitting layer 204 and the electron transport layer 205 may be fabricated by a solution process and the solution process may include, for example: dipping a substrate (not shown) having the anode 200 and the hole injection layer 201 into a desired solvent for a material used for the foregoing film or layer; applying the foregoing solvent over the top of the substrate having the anode 200 and the hole injection layer 201 by spin coating, roll printing, nozzle coating to continuously spray the solvent over the substrate, slit coating using a flat slit so as to coat a part corresponding to the slit, ink jetting the solvent in dot units, and so forth.

As illustrated above, all of the hole injection layer 201, the interlayer 202, the light emitting layer 204 and the electron transport layer 205 except for the cathode 206 may be fabricated by the foregoing solution process.

The interlayer 202 may be selectively separated into the hydrophilic region 203 and the hydrophobic region by UV irradiation and, after the irradiation, may have both the hydrophilic region and the hydrophobic region. Accordingly, if a UV irradiated portion in the hydrophobic region of the interlayer 202 is modified to have hydrophilic properties, the remaining hydrophobic groups meet with other hydrophobic groups of a solvent for each layer formed by the solution process so as to enable coating of the layer.

Figure 4A:
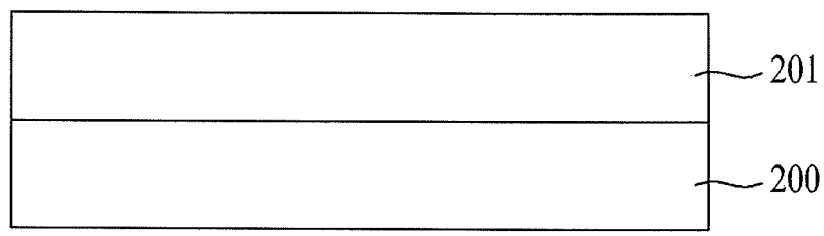
FIGS. 4A to 4G are cross-sectional views illustrating a process for fabrication of an organic light emitting display device according to an exemplary embodiment.
Figure 4B:
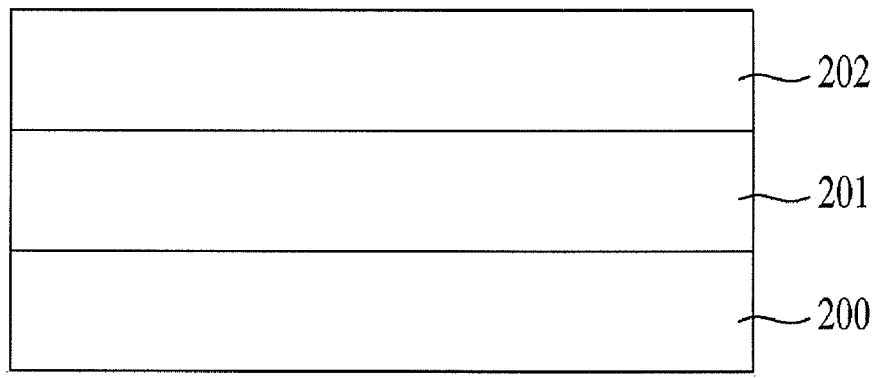
Figure 4C:
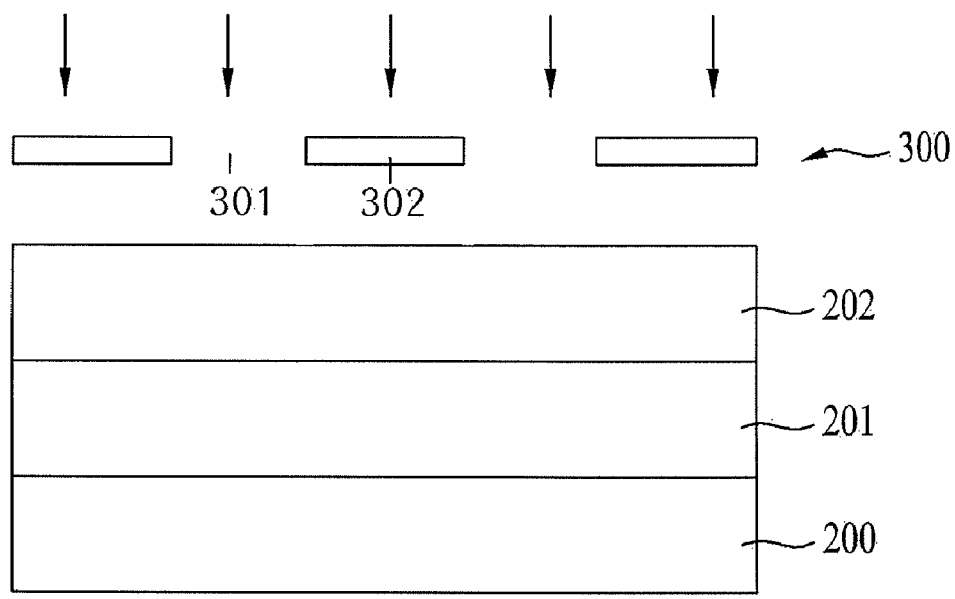
Figure 4D:
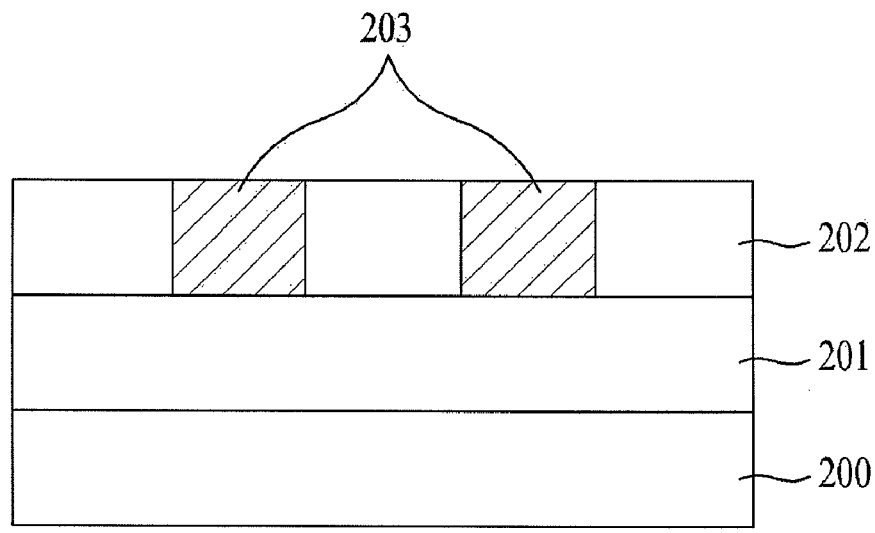
Figure 4E:
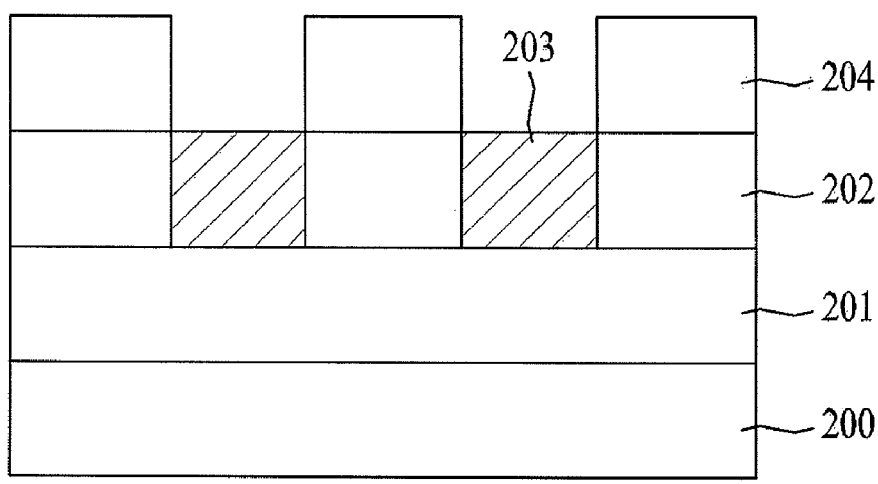
Figure 4F:
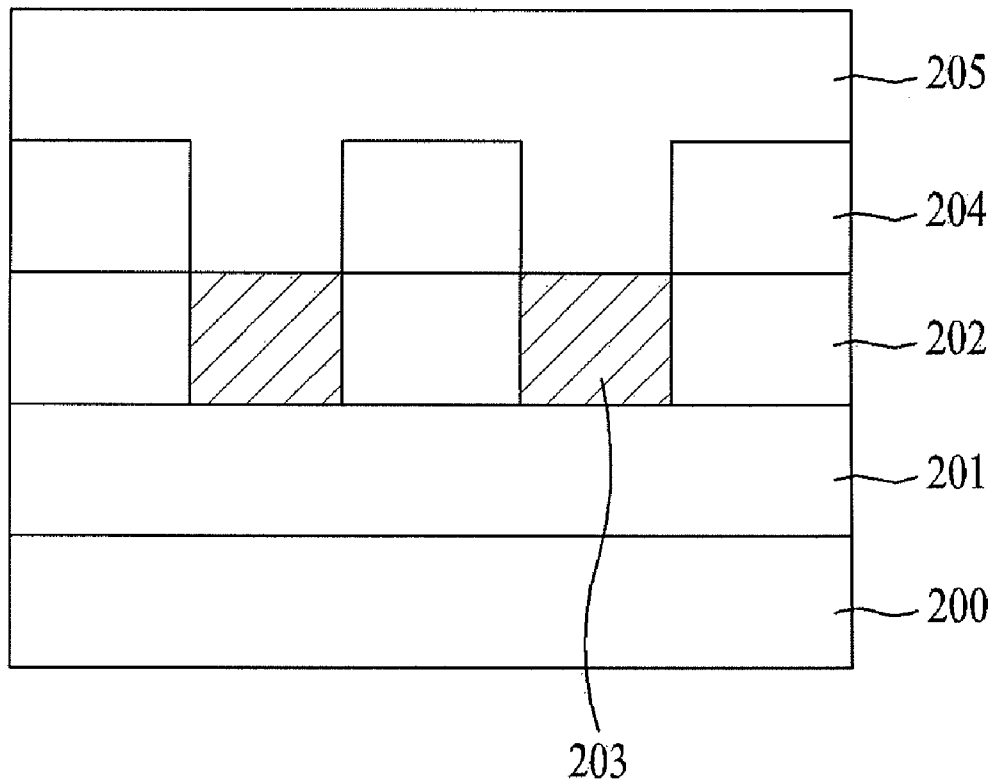
Figure 4G:
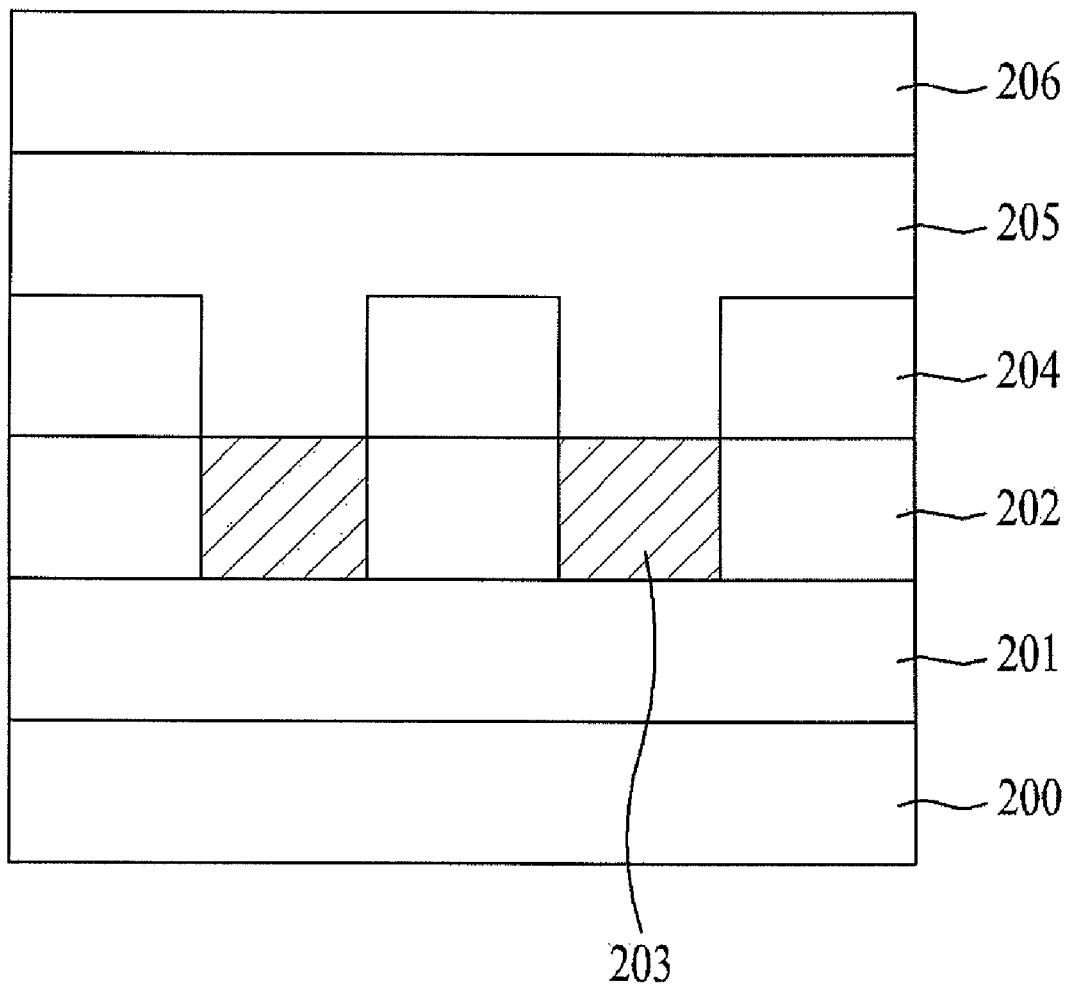
Figure 5A:
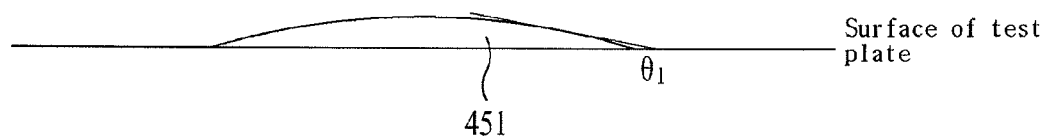
FIGS. 5A to 5C depict water contact angles of solutions with different properties.
Figure 5B:
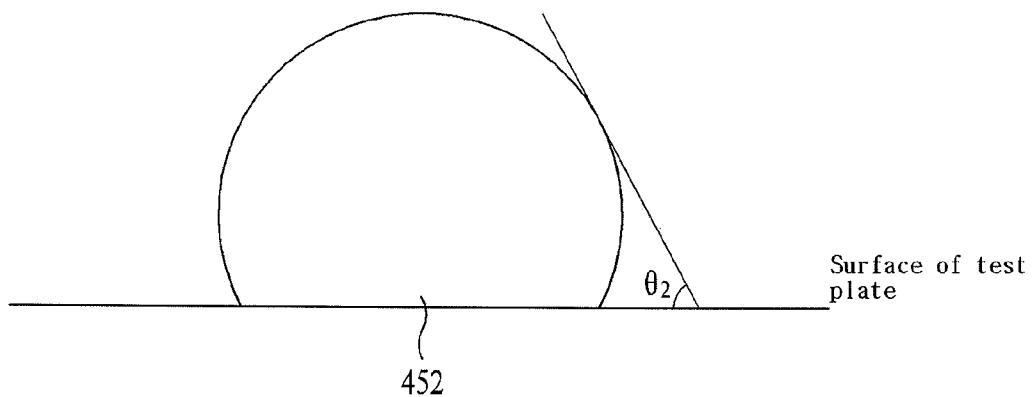
Figure 5C:
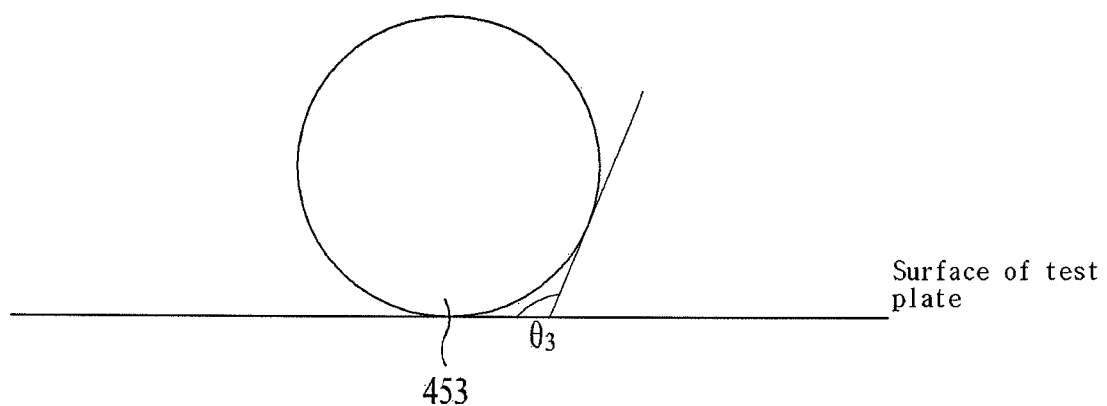

FIGS. 4A to 4G are cross-sectional views illustrating a process for fabrication of an organic light emitting display device according to an exemplary embodiment of the present invention, while FIGS. 5A to 5C depict water contact angles of solutions with different properties.

The following description will be given of a method for manufacturing an organic light emitting display device according to another exemplary embodiment of the present invention.

First, a substrate (not shown) having a plurality of pixel regions defined in a matrix form is prepared. For each of the pixel regions on the substrate, a thin film transistor is provided. Although not illustrated, the thin film transistor may comprise a gate electrode arranged at a desired site on the substrate, a semiconductor layer formed on top of the gate electrode by interposing a gate insulation film therebetween, and a source/drain electrode arranged at both ends of the semiconductor layer.

As shown in FIG. 4A, an anode 200 is formed in each pixel region. The anode 200 may be connected to the thin film transistor.

Next, a hole injection layer 201 is placed on the anode 200. As described above, the hole injection layer 201 may comprise a material with moderate acidity to protect the thin film transistor from damage, and may be composed of PEDOT: PSS with improved conductive properties. In this case, the hole injection layer 201 is formed by coating the anode with a solution including the foregoing material at 1,000 to 3,000 rpm and baking the coating at not more than 200° C. for 5 to 30 minutes. In order to improve coating ability and to control coating thickness, water or any other organic solvent such as alcohol, glycol, etc. may be added during coating. Here, the material of the hole injection layer 201 is not particularly restricted to PEDOT:PSS and may also include any materials subjected to the solution process.

Following this, as shown in FIG. 4B, an interlayer 202 having hydrophobic surface characteristics with a water contact angle of 70° or more is formed on top of the hole injection layer 201. This interlayer 202 may be composed of a material exhibiting hydrophobicity at a surface coming into contact with a following layer to be formed.

As illustrated in FIGS. 5A to 5C, the water contact angle means an angle between a normal line passing the surface of a solution and a test plate, when the solution falls on the test plate.

FIG. 5A shows a strong hydrophilic material to illustrate that the foregoing solution 451 sufficiently spreads on the test plate. That is, it is found that a water contact angle $\Theta_1$ of the material is very small such as not more than 20°.

FIG. 5B shows a solution 452 with a water contact angle $\Theta_2$ corresponding to a boundary between hydrophilic and hydrophobic properties, approximately 60° or less.

FIG. 5C shows a super-hydrophobic solution 453, wherein a water contact angle $\Theta_3$ of the solution is 90° or more. Such a solution contains a material to capture hydrophobic ingredients on a surface of the super-hydrophobic solution 453 when a hydrophobic material is applied to the top of the solution, while applying a hydrophilic material to the top of the solution pushes hydrophilic ingredients out of the solution so as to substantially eliminate the hydrophilic ingredients from the super-hydrophobic solution 453.

Briefly, decreasing the water contact angle of the solution may increase hydrophilic properties of the solution while increasing the water contact angle may tend to increase hydrophobic properties of the solution.

With the water contact angle of approximately not less than 70°, the material is considered to exhibit hydrophobic tendencies. The interlayer 202 may comprise any one selected from hydrophobic materials with a water contact angle of not less than 70°, as shown in FIGS. 5B and 5C.

Formation of the interlayer 202 may be performed by the solution process, for example, dipping a substrate (not shown) having the anode 200 and the hole injection layer 201 into an interlayer material or, otherwise, applying the interlayer material to the top of the substrate having the anode 200 and the hole injection layer 201 by at least one selected from a group consisting of spin coating, roll printing, nozzle coating, slit coating and ink-jetting.

A functional group contained in the interlayer material may have at least one bond selected from a group consisting of C—C, C=N, C=C, Si—O, C—O and C=O. For example, the interlayer may contain at least one selected from a group consisting of imide, amine, silane, carbonate, ester, acetate, sulfonate, nitrate, ketone, fluorine, oxetane and epoxy. More particularly, the interlayer comprises triphenylamine.

As shown in FIG. 4C, the interlayer 202 is subjected to UV irradiation using a mask 300 (having a transmission part 301 and a shading part 302).

UV irradiating a material of the interlayer 202 as shown in FIG. 4D, an irradiated portion of the interlayer has a water contact angle of not more than 70° which in turn changes the hydrophobic properties of the irradiated portion into hydrophilic properties, thus forming a transformation part 203 in the interlayer 202.

Accordingly, the transformation part 203 modified after UV irradiation may exhibit hydrophilic properties while the other part of the interlayer remains hydrophobic. Consequently, when a following film is formed above the interlayer 202 having the transformation part 203, selective patterning may be carried out depending on whether the formed film is hydrophilic or hydrophobic.

UV irradiation of the interlayer 202 may be conducted at a wavelength of about 100 to about 400 nm, preferably, 150 to 260 nm. Further, a pressure required for UV irradiation may range from about $1 \times 10^{-5}$ torr to about 800 torr.

As illustrated in FIG. 4E, the interlayer 202 having the transformation part 203 is subjected to a solution process in order to selectively form a light emitting layer 204 at a site retaining hydrophobic properties due to not being subjected to UV irradiation. Such selective formation of the light emitting layer 204 does not require specific external influences or conditions but is attained by the interlayer 202 having the transformation part 203 modified into hydrophilic conditions. Accordingly, the light emitting layer 204 is formed by differences in physical properties of different regions of the interlayer 202. That is, the solution sprayed over the interlayer 202 may remain on the interlayer 202 selectively excluding the transformation part 203 thereof.

As illustrated in FIG. 4F, an electron transport layer 205 is placed on the substrate having the light emitting layer 204.

The light emitting layer 204 and the electron transport layer 205 may be provided as a combined film wherein the electron transport layer 205 may comprise hydrophobic ingredients.

Each of the hole injection layer 201, the interlayer 202, the light emitting layer 204 and the electron transport layer 205 may be formed using the solution process, especially, by dipping, spin coating, nozzle coating, roll printing, slit coating and/or ink-jetting as described above.

Alternatively, the electron transport layer 205 capable of being formed throughout the substrate may also be provided by evaporation deposition.

Subsequently, as illustrated in FIG. 4G, a cathode 206 is formed on top of the electron transport layer 205.

The hole injection layer 201, the interlayer 202, the light emitting layer 204 and the electron transport layer 205 may be separately prepared by a solution process, or a combination of two or more thereof may be formed. In consideration of convenience, the interlayer 202 requires UV radiation for region segmentation and, therefore, the foregoing solution process may be separately performed before and after formation of the interlayer 202.

FIGS. 6A to 6G are cross-sectional views illustrating a process for fabrication of an organic light emitting display device according to another exemplary embodiment of the present invention.

A method for manufacturing an organic light emitting display device according to another exemplary embodiment of the present invention may be progressed by the following steps.

First, a substrate (not shown) having a plurality of pixel regions defined in a matrix form is prepared. For each of the pixel regions on the substrate, a thin film transistor is provided. Although not illustrated, the thin film transistor may comprise a gate electrode arranged at a desired site on the substrate, a semiconductor layer formed on top of the gate electrode by interposing a gate insulation film therebetween, and a source/drain electrode arranged at both ends of the semiconductor layer.

Figure 6A:
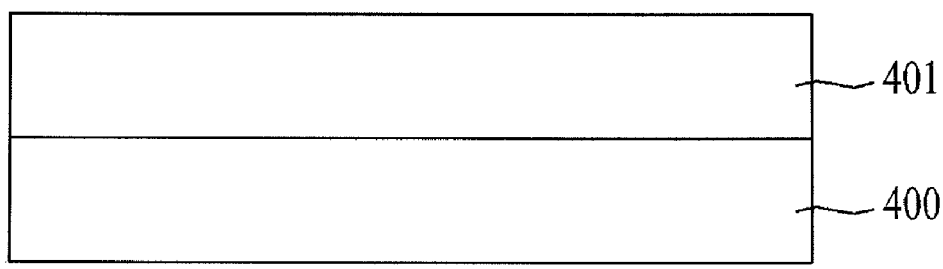
FIGS. 6A to 6G are cross-sectional views illustrating a process for fabrication of an organic light emitting display device according to another exemplary embodiment.

As shown in FIG. 6A, an anode 400 is formed in each pixel region such that the anode is connected to the thin film transistor.

Next, a hole injection layer 401 is placed on the anode 400. As described above, the hole injection layer 401 may comprise a material with moderate acidity to protect the thin film transistor from damage, and may be composed of PEDOT:PSS with improved conductive properties. In this case, the hole injection layer 401 is formed by coating the anode with a solution including the foregoing material at 1,000 to 3,000 rpm and baking the coating at not more than 200° C. for 5 to 30 minutes. In order to improve coating ability and to control coating thickness, water or any other organic solvent such as alcohol, glycol, etc. may be added during coating. Here, the material of the hole injection layer 401 is not particularly restricted to PEDOT:PSS and may also include any materials having characteristics of a hydrophilic conductive polymer material.

Figure 6B:
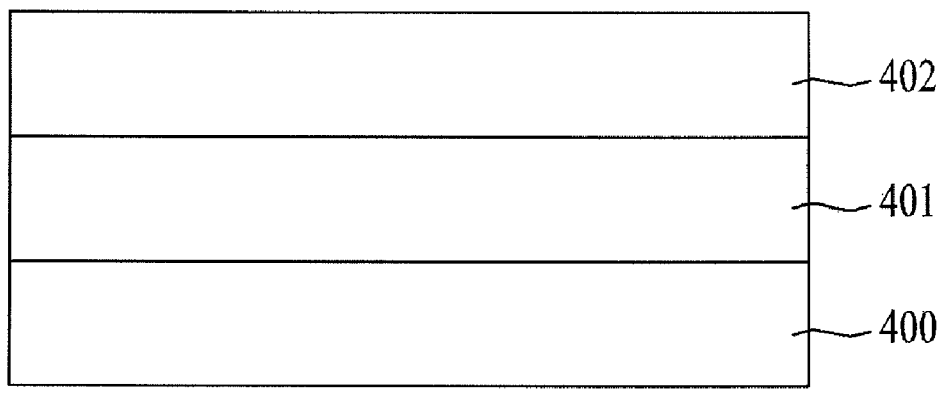

Following this, as shown in FIG. 6B, an interlayer 402 having hydrophobic surface characteristics with a water contact angle of 70° or more is formed on top of the hole injection layer 401. This interlayer 402 may be composed of a material exhibiting hydrophobicity at a surface coming into contact with a following layer to be formed.

Formation of the interlayer 402 may be performed by the solution process, for example, dipping a substrate (not shown) having the anode 400 and the hole injection layer 401 into an interlayer material, or applying the interlayer material to the top of the substrate having the anode 400 and the hole injection layer 401 by at least one selected from a group consisting of spin coating, roll printing, slit coating, nozzle coating and ink-jetting.

After UV irradiation, the foregoing interlayer material is subjected to patterning and may comprise a material exhibiting UV absorption or photolysis performance. For instance, if the interlayer material has UV photolysis performance, an UV irradiated part will be duly eliminated after UV irradiation. In contrast, when the interlayer material has UV absorption and cross-linkable ability, only a UV irradiated part remains after UV irradiation.

Such an interlayer 402 may entirely cover the hole injection layer 401 with excellent adhesiveness during coating regardless of hydrophilic/hydrophobic properties of the hole injection layer. Subsequently, hydrophobic groups present in the remaining pattern, which was formed after UV irradiation, may support adhesion of ingredients (hydrophobic groups) coated by the solution process during formation of a following light emitting layer.

A functional group contained in a material for the interlayer 402 may have at least one bond selected from a group consisting of C—C, C=N, C=C, Si—O, C—O and C=O. For instance, the interlayer may contain at least one selected from a group consisting of imide, amine, silane, carbonate, ester, acetate, sulfonate, nitrate, ketone, fluorine, oxetane and epoxy. More particularly, the interlayer may contain triphenylamine.

The foregoing material for the interlayer may be a material having a cross-linkable group (exhibiting UV absorption) and/or a functional group with UV photolysis performance.

Figure 6C:
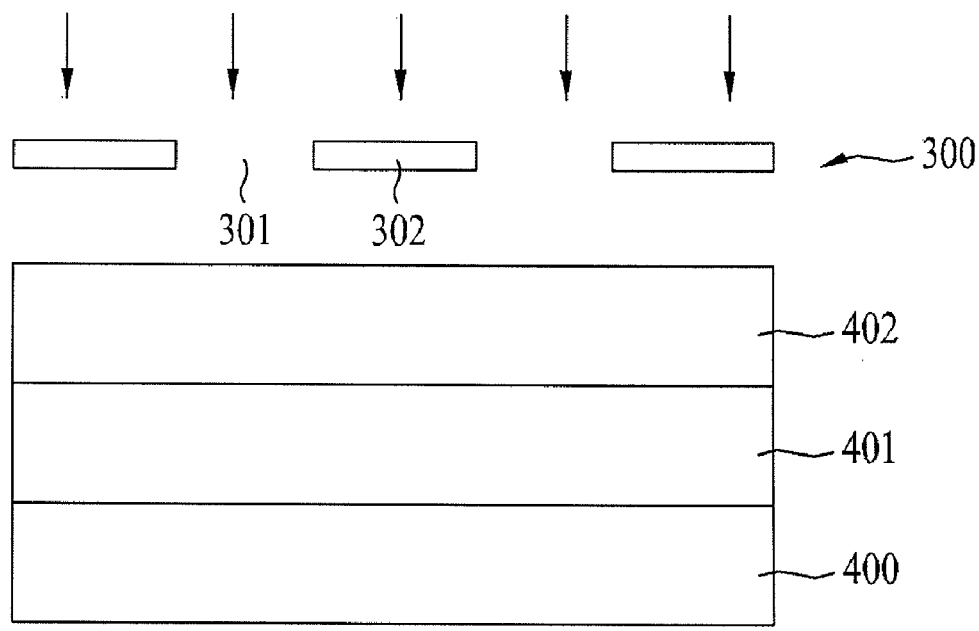
Figure 6D:
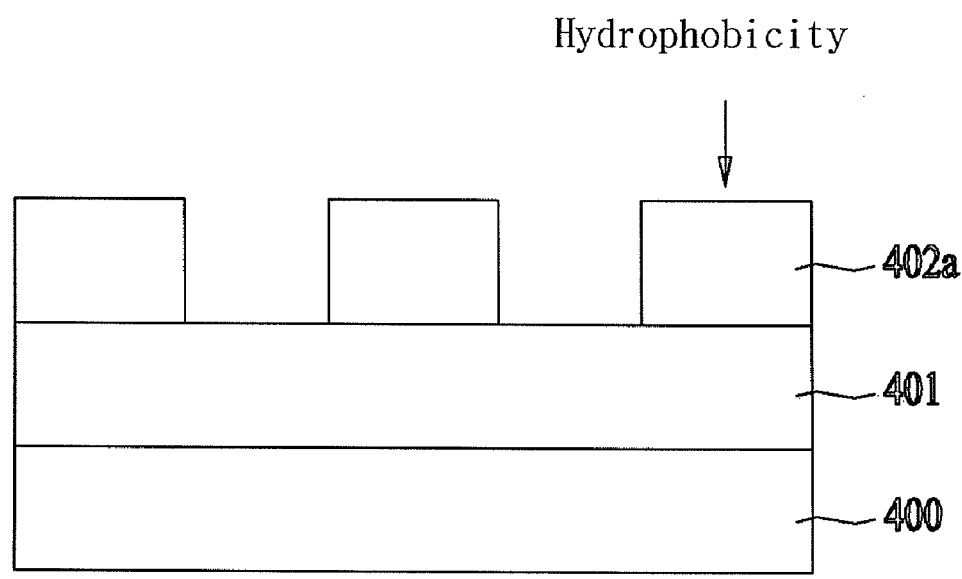

As illustrated in FIG. 6C, the interlayer 402 is subjected to UV irradiation using a mask 300 (having a transmission part 301 and a shading part 302) and patterning, so as to produce an interlayer pattern 402a, as illustrated in FIG. 6D. The interlayer pattern 402a is obtained by the patterning process to leave behind a hydrophobic region. On the other hand, a part activated by UV irradiation is eliminated while the hydrophobic interlayer pattern 402a may yet remain on the top of the hole injection layer, as illustrated in FIG. 6D. UV irradiation of the interlayer 402 may be conducted at a wavelength of about 100 to about 400 nm, preferably, 150 to 260 nm. A pressure of UV irradiation may range from about $1 \times 10^{-5}$ torr to about 800 torr. In the drawings, the interlayer 402 is an illustrative example of materials with photolysis performance. For a material with absorptive performance, using a mask 300 in a reverse form relative to that illustrated in FIG. 6C may produce the interlayer pattern 402a illustrated in FIG. 6D.

Figure 6E:
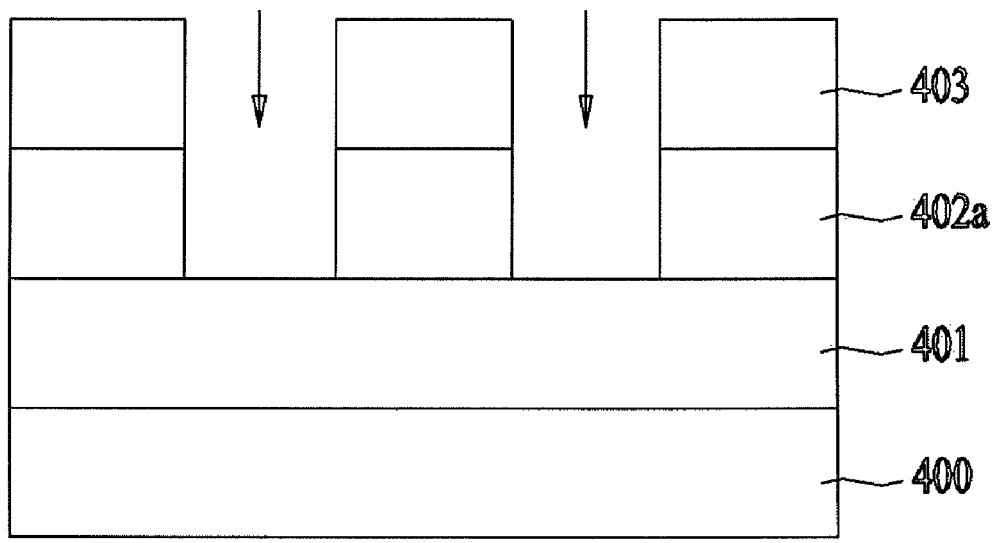

As illustrated in FIG. 6E, a light emitting layer 404 is formed on the interlayer pattern 402a remaining as the hydrophobic region by the solution process. Formation of the light emitting layer 404 does not require specific external influences or conditions but is provided on the hydrophobic interposing pattern 402a patterned by UV irradiation. Here, the light emitting layer 404 including an organic emitting material with high hydrophobicity is formed on the top of the hydrophobic interlayer pattern 402a by differences in physical properties of an area at which the above hydrophobic interlayer pattern 402a is present and the other area without the pattern. That is, since the hole injection layer 401 exposed between plural interlayer patterns 402a is hydrophilic, a solution sprayed throughout the interlayer including the foregoing film patterns 402a may selectively remain on the film patterns 402a with hydrophobic properties.

The solution process used for forming the light emitting layer 404 may include dipping the substrate (not shown) having the anode 400, the hole injection layer 401 and the interlayer pattern 402a into a light emitting material or, otherwise, applying the light emitting material to the top of the substrate having the anode 400, the hole injection layer 401 and the interlayer pattern 402a by spin coating, nozzle coating, roll printing or ink-jetting.

Figure 6F:
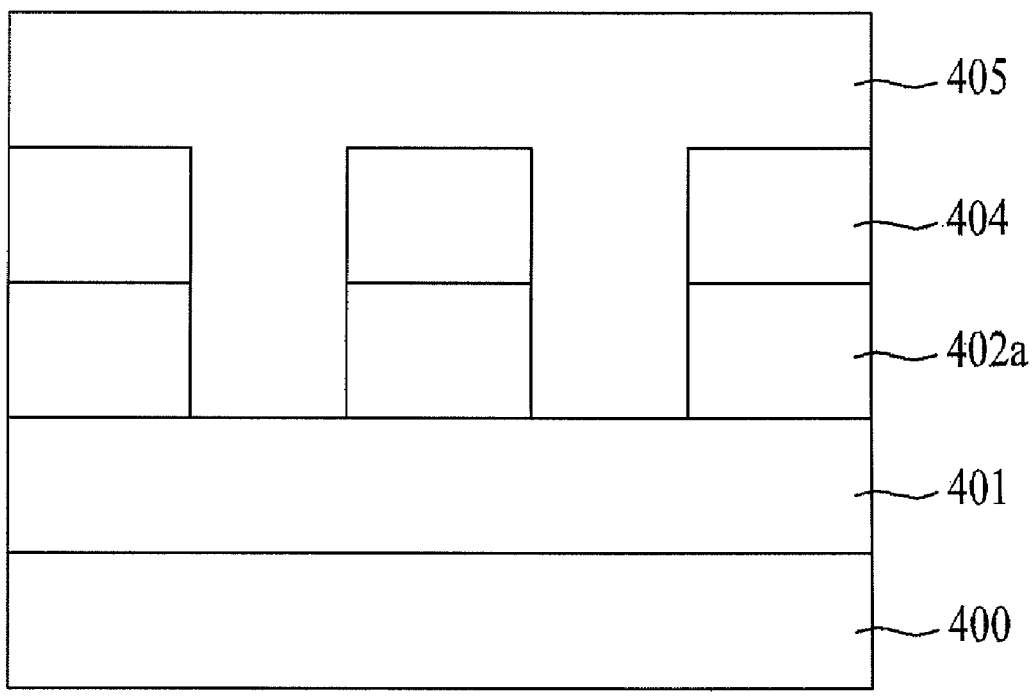

Next, as shown in FIG. 6F, an electron transport layer 405 is placed on the substrate (not shown) having the light emitting layer 404.

The light emitting layer 404 may be combined with a hole transport layer (not shown) and the foregoing electron transport layer 405 to form a single laminate layer.

Each of the interlayer 402, the hole transport layer, the light emitting layer 404 and the electron transport layer 405 described above may be formed using the solution process, especially, by dipping, spin coating, nozzle coating, roll printing, slit coating and/or ink-jetting described above. Here, the interlayer 402, the light emitting layer 404 and the electron transport layer 405 may be separately formed or, otherwise, may form a region defined by a single patterning.

Alternatively, the electron transport layer 405 capable of being formed throughout the substrate may also be provided by evaporation deposition.

Figure 6G:
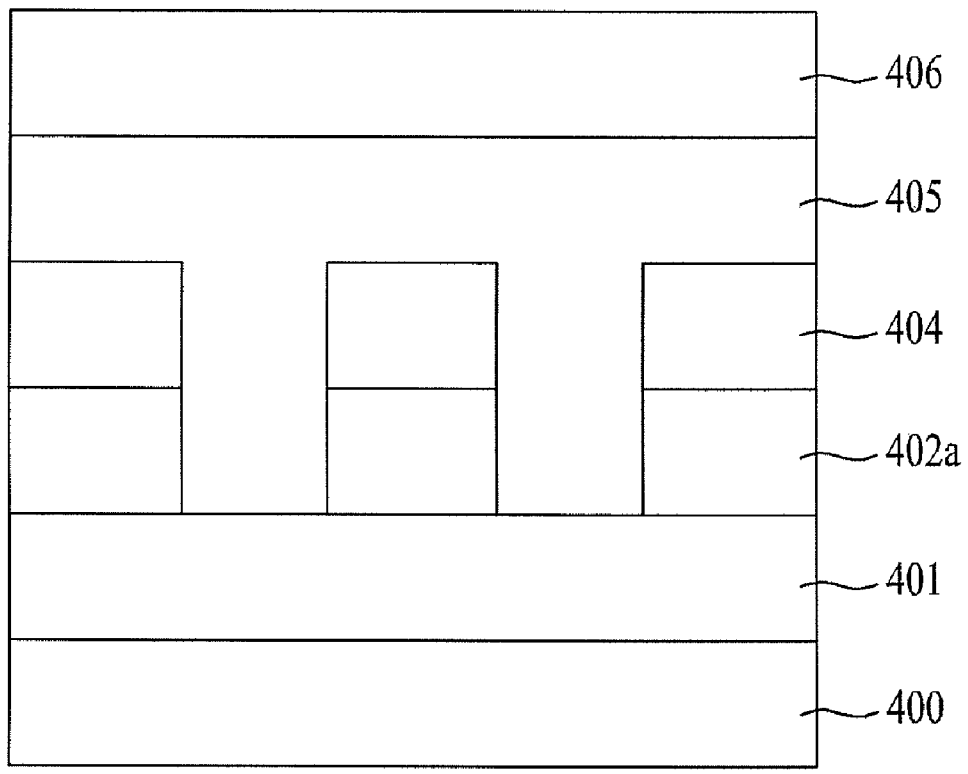

Subsequently, as illustrated in FIG. 6G, a cathode 406 is formed on top of the electron transport layer 405.

Hereinafter, material properties of the interlayer used in an organic light emitting display device according to the present invention will be more concretely discussed.

A top of the interlayer formed on the hole injection layer is hydrophobic. If a film formed thereon is hydrophobic, a part of the formed film is subjected to UV irradiation to modify the irradiated portion only, thereby enabling selective formation of a light emitting layer only on the hydrophobic area without using an alternative mask. The top of the formed interlayer is hydrophobic and in turn may be modified to be hydrophilic by UV irradiation or may have UV absorption or photolysis performance, so that only the irradiated part remains or is eliminated.

As disclosed in the above description, the method for manufacturing an organic light emitting display device of the present invention may include: forming a hole injection layer 201 or 401 on an anode 200 or 400; forming an interlayer 202 or 402 thereon; UV irradiating the interlayer 202 or 402 to define a hydrophilic region 203 on the interlayer 202 or, otherwise, removing a UV irradiated portion to form an interlayer pattern 402a to selectively expose a bottom hole injection layer 401; separating the pattern into a hydrophilic region and a hydrophobic region; and selectively forming a light emitting layer 204 or 404 in only the hydrophobic region of the interlayer or the interlayer pattern 202 or 402a. Briefly, as for formation of a film such as the light emitting layer 204 or 404, even when a desired solvent for the film is hydrophobic, the solvent comes into contact with a hydrophobic-treated face of the interlayer which in turn enables precise alignment of the solvent in a patterned region of the interlayer.

The interlayer 202 or the interlayer pattern 402a may be fabricated using a UV active material, for example, one that is cross-linkable or degradable at an irradiated site or has specific physical properties such as hydrophobicity modified into hydrophilicity. After UV irradiation of the interlayer, the irradiated layer is aligned on a surface treated region so as to enable precise alignment of the top layer (the light emitting layer 204 or 404) in a desired position.

The above description will be more apparent from the following test results in relation to UV irradiation of an interlayer comprising each of the foregoing materials represented by Formulae 1 to 3.

First, a pixel accuracy of each interlayer formed using the material represented by Formula 1 was examined. It was found that the UV treated interlayer exhibited 20% higher pixel accuracy, compared to the interlayer without UV treatment. Also, all of the interlayers subjected to UV treatment have a pixel accuracy of not less than 95% and essentially no alignment error was detected.

TABLE 1

| Number of treatment | Pixel accuracy of UV treated interlayer (%) | Pixel accuracy at UV un-treated interlayer (%) |
| --- | --- | --- |
| 1 | 95 | 72 |
| 2 | 96 | 75 |
| 3 | 98 | 74 |

A pixel accuracy of each interlayer formed using the material represented by Formula 2 was examined. It was found that the UV treated interlayer exhibited 20% higher pixel accuracy, compared to the interlayer without UV treatment. Also, all of the interlayers subjected to UV treatment have a pixel accuracy of not less than 94% and essentially no alignment error was detected.

TABLE 2

| Number of treatment | Pixel accuracy of UV treated interlayer (%) | Pixel accuracy at UV un-treated interlayer (%) |
| --- | --- | --- |
| 1 | 94 | 74 |
| 2 | 95 | 72 |
| 3 | 97 | 74 |

A pixel accuracy of each interlayer formed using the material represented by Formula 3 was examined. Similarly to the above results, it was found that the UV treated interlayer exhibited 18% higher pixel accuracy, compared to the interlayer without UV treatment. Also, all of the interlayers subjected to UV treatment have a pixel accuracy of not less than 94% and essentially no alignment error was detected.

TABLE 3

| Number of treatment | Pixel accuracy of UV treated interlayer (%) | Pixel accuracy at UV un-treated interlayer (%) |
| --- | --- | --- |
| 1 | 96 | 78 |
| 2 | 97 | 74 |
| 3 | 94 | 76 |

For the fabricated organic light emitting display device, a layer (such as an interlayer, a light emitting layer, an electron transport layer, etc.) may be formed above the hole injection layer by the solution process and, therefore, a shadow mask typically used in the art may be omitted. As a result, process failure possibly caused by the shadow mask may be effectively prevented, thus enhancing productivity and yield. The present invention may enable film treatment and patterning using film characteristics and may be favorably applied to manufacturing of a large-scale organic light emitting display device.

Placing an interlayer on top of a hole injection layer, a solution process may be performed at an interface of the hole injection layer and an upper layer thereon without difficulty. The hole injection layer may be formed using a conductive polymer material so as to enhance luminance relative to current and extend a lifespan of a display device.

Although technical constructions and other features of the present invention have been described, it will be apparent to those skilled in the art that the present invention is not limited to the exemplary embodiments and accompanying drawings described above but may cover substitutions, variations and/or modifications thereof without departing from the scope of the invention defined in the appended claims.

What is claimed is:

1. A method for manufacturing an organic light emitting display device, comprising:
preparing a substrate having a plurality of pixel regions defined in a matrix form;
arranging an anode in each of the pixel regions;
forming a hole injection layer on the anode by a solution process;
forming an interlayer with hydrophobic properties on the hole injection layer by the solution process;
selectively UV irradiating the interlayer to define a hydrophilic region on the interlayer;
forming a light emitting layer in a hydrophobic region of the interlayer except for the UV irradiated portion by the solution process; and
arranging a cathode on the substrate having the light emitting layer.

2. A method for manufacturing an organic light emitting display device, comprising:
preparing a substrate having a plurality of pixel regions defined in a matrix form;
arranging an anode in each of the pixel regions;
forming a hole injection layer on the anode by a solution process;
forming an interlayer with a water contact angle of 70° or more and hydrophobic properties on the hole injection layer by the solution process;
selectively UV irradiating the interlayer to enable hydrophilic treatment of the interlayer so as to have a water contact angle of less than 70° at the UV irradiated portion of the interlayer;

forming a light emitting layer in a hydrophobic region of the interlayer except for the UV irradiated portion by the solution process; and arranging a cathode on the substrate having the light emitting layer.

3. The method according to claim 2, wherein the formation of the interlayer comprises dipping the substrate having the anode and the hole injection layer into an interlayer material or, otherwise, applying the interlayer material to the top of the substrate having the anode and the hole injection layer by at least one selected from a group consisting of spin coating, roll printing, slit coating, nozzle coating and ink-jetting.

4. The method according to claim 2, wherein the formation of the light emitting layer comprises dipping the substrate having the anode, the hole injection layer and the interlayer into a light emitting material or, otherwise, applying the light emitting material to the top of the substrate having the anode, the hole injection layer and the interlayer by at least one selected from a group consisting of spin coating, roll printing, slit coating; nozzle coating and ink-jetting.

5. The method according to claim 2, further comprising: after formation of the light emitting layer, forming an electron transport layer on top of the light emitting layer by at least one selected from a group consisting of dipping, spin coating, nozzle coating, slit coating, roll printing, ink-jetting and evaporation deposition.

6. The method according to claim 2, wherein the interlayer is composed of a material exhibiting UV absorption or photolysis performance.

7. The method according to claim 2, wherein the interlayer contains an organic substance having at least one bond selected from C—C, C=N, C=C, Si—O, C—O and C=O.

8. The method according to claim 7, wherein the interlayer contains at least one selected from a group consisting of imide, amine, silane, carbonate, ester, acetate, sulfonate, nitrate, ketone, fluorine, oxetane and epoxy.

9. The method according to claim 8, wherein the interlayer contains triphenylamine.

10. The method according to claim 2, wherein the UV irradiation is performed at a wavelength of about 150 to about 260 nm.

11. The method according to claim 2, wherein a pressure of the UV irradiation ranges from about $1\times10^{-5}$ torr to about 800 torr.

12. A method for manufacturing an organic light emitting display device, comprising:

preparing a substrate having a plurality of pixel regions defined in a matrix form;

arranging an anode in each of the pixel regions;

forming a hole injection layer on the anode by a solution process;

forming an interlayer with hydrophobic properties on the hole injection layer by the solution process;

selectively UV irradiating the interlayer to pattern the same;

forming a light emitting layer in a hydrophobic region of the patterned interlayer except for the UV irradiated portion by the solution process; and arranging a cathode on the substrate having the light emitting layer.

13. The method according to claim 12, wherein the formation of the interlayer comprises dipping the substrate having the anode and the hole injection layer into an interlayer material or, otherwise, applying the interlayer material to the top of the substrate having the anode and the hole injection layer by at least one selected from a group consisting of spin coating, roll printing, nozzle coating, slit coating and ink-jetting.

14. The method according to claim 12, wherein the formation of the light emitting layer comprises dipping the substrate having the anode, the hole injection layer and the interlayer into a light emitting material or, otherwise, applying the light emitting material to the top of the substrate having the anode, the hole injection layer and the interlayer by at least one selected from a group consisting of spin coating, roll printing, nozzle coating, slit coating and ink-jetting.

15. The method according to claim 12, further comprising: before or after formation of the light emitting layer, forming an electron transport layer on top of the light emitting layer by at least one selected from a group consisting of dipping, spin coating, nozzle coating, roll printing, slit coating and ink-jetting.

16. The method according to claim 12, wherein the interlayer is composed of a material exhibiting UV absorption or photolysis performance.

17. The method according to claim 12, wherein the interlayer contains an organic substance having at least one bond selected from C—C, C=N, C=C, Si—O, C—O and C=O.

18. The method according to claim 17, wherein the interlayer contains at least one selected from a group consisting of imide, amine, silane, carbonate, ester, acetate, sulfonate, nitrate, ketone, fluorine, oxetane and epoxy.

19. The method according to claim 18, wherein the interlayer contains triphenylamine.

20. The method according to claim 12, wherein the UV irradiation is performed at a wavelength of about 150 to about 260 nm under a pressure of from about $1\times10^{-5}$ torr to about 800 torr.

* * * * *